United States Patent
Nashner et al.

(10) Patent No.: US 12,324,114 B2
(45) Date of Patent: Jun. 3, 2025

(54) LASER-MARKED ELECTRONIC DEVICE HOUSINGS

(71) Applicant: Apple Inc., Cupertino, CA (US)

(72) Inventors: Michael S. Nashner, San Jose, CA (US); Erica K. Block, Cupertino, CA (US); Shota Aoyagi, San Francisco, CA (US)

(73) Assignee: APPLE INC., Cupertino, CA (US)

( * ) Notice: Subject to any disclaimer, the term of this patent is extended or adjusted under 35 U.S.C. 154(b) by 477 days.

(21) Appl. No.: 17/897,061

(22) Filed: Aug. 26, 2022

(65) Prior Publication Data

US 2023/0111348 A1  Apr. 13, 2023

Related U.S. Application Data

(60) Provisional application No. 63/248,271, filed on Sep. 24, 2021.

(51) Int. Cl.
*B23K 26/352* (2014.01)
*H05K 5/00* (2006.01)
*H05K 5/02* (2006.01)

(52) U.S. Cl.
CPC ......... *H05K 5/0243* (2013.01); *B23K 26/352* (2015.10); *H05K 5/0086* (2013.01)

(58) Field of Classification Search
CPC ............ B23K 2101/04; B23K 2103/16; B23K 2103/42; B23K 26/0006; B23K 26/0622; B23K 26/352; B23K 26/355; H05K 5/0086; H05K 5/0243
See application file for complete search history.

(56) References Cited

U.S. PATENT DOCUMENTS

| | | | |
|---|---|---|---|
| 2,647,079 | A | 7/1953 | Burnham |
| 2,812,295 | A | 11/1957 | Patrick |
| 2,990,304 | A | 6/1961 | Cybriwsky et al. |
| 3,080,270 | A | 3/1963 | Fritz |
| 3,316,866 | A | 5/1967 | Shelton |
| 3,526,694 | A | 9/1970 | Lemelson |
| 3,615,432 | A | 10/1971 | Jenkins et al. |
| 3,645,777 | A | 2/1972 | Sierad |
| RE28,225 | E | 11/1974 | Heseltine et al. |
| 2,346,531 | A | 1/1981 | Adachi et al. |
| 4,247,600 | A | 1/1981 | Adachi et al. |

(Continued)

FOREIGN PATENT DOCUMENTS

| | | |
|---|---|---|
| CN | 1362125 | 8/2002 |
| CN | 1306526 | 3/2007 |

(Continued)

OTHER PUBLICATIONS

Annerfors et al., "Nano Molding Technology on Cosmetic Aluminum Parts in Mobile Phones," Division of Production and Materials Engineering, LTH, 2007.

(Continued)

*Primary Examiner* — Lawrence D Ferguson
(74) *Attorney, Agent, or Firm* — Brownstein Hyatt Farber Schreck, LLP

(57) ABSTRACT

A housing for an electronic device is disclosed. A surface of the housing includes a laser-formed marking. The marking comprises a plurality of laser-formed pixels and may include a grayscale image. Electronic devices including the laser-marked housings and techniques for laser-marking the housings are also disclosed.

20 Claims, 6 Drawing Sheets

(56) References Cited

U.S. PATENT DOCUMENTS

| | | |
|---|---|---|
| 4,269,947 A | 5/1981 | Inata et al. |
| 4,347,428 A | 8/1982 | Conrad et al. |
| 4,531,705 A | 7/1985 | Nakagawa et al. |
| 4,547,649 A | 10/1985 | Butt et al. |
| 4,564,001 A | 1/1986 | Maeda |
| 4,651,453 A | 3/1987 | Doyle |
| 4,686,352 A | 8/1987 | Nawrot et al. |
| 4,756,771 A | 7/1988 | Brodalla et al. |
| 4,822,973 A | 4/1989 | Fahner |
| 2,989,325 A | 6/1990 | Mullaney |
| 4,931,366 A | 6/1990 | Mullaney |
| 4,993,148 A | 2/1991 | Adachi et al. |
| 5,202,013 A | 4/1993 | Chamberlain |
| 5,215,864 A | 6/1993 | Laakmann |
| 5,224,197 A | 6/1993 | Zanoni et al. |
| 5,288,344 A | 2/1994 | Peker et al. |
| 5,417,905 A | 5/1995 | Lemaire et al. |
| 5,420,575 A | 5/1995 | Cheraso |
| 5,540,867 A | 7/1996 | DeBello |
| 5,645,964 A | 7/1997 | Nohr et al. |
| 5,719,379 A | 2/1998 | Huang et al. |
| 5,744,270 A | 4/1998 | Pearlman et al. |
| 5,789,466 A | 8/1998 | Birmingham et al. |
| 5,808,268 A | 9/1998 | Balz |
| 5,837,086 A | 11/1998 | Leeb et al. |
| 5,872,699 A | 2/1999 | Nishii et al. |
| 5,925,847 A | 7/1999 | Rademacher et al. |
| 5,943,799 A | 8/1999 | Xu et al. |
| 6,007,929 A | 12/1999 | Robertson et al. |
| 6,101,372 A | 8/2000 | Kubo |
| 6,169,266 B1 | 1/2001 | Hughes |
| 6,325,868 B1 | 12/2001 | Kim et al. |
| 6,331,239 B1 | 12/2001 | Shirota et al. |
| 6,480,397 B1 | 11/2002 | Hsu et al. |
| 6,574,096 B1 | 6/2003 | Difonzo et al. |
| 6,590,183 B1 | 7/2003 | Yeo |
| 6,633,019 B1 | 10/2003 | Gray |
| 6,746,724 B1 | 6/2004 | Robertson et al. |
| 6,802,952 B2 | 10/2004 | Hsu et al. |
| 6,821,305 B2 | 11/2004 | Yan |
| 6,966,133 B2 | 11/2005 | Krings et al. |
| 6,996,425 B2 | 2/2006 | Watanabe |
| 7,065,820 B2 | 6/2006 | Meschter |
| 7,134,198 B2 | 11/2006 | Nakatani et al. |
| 7,181,172 B2 | 2/2007 | Sullivan et al. |
| 7,225,529 B2 | 6/2007 | Wang |
| 7,284,396 B2 | 10/2007 | Barron et al. |
| 7,459,373 B2 | 12/2008 | Yoo |
| 7,508,644 B2 | 3/2009 | Cheung et al. |
| 7,622,183 B2 | 11/2009 | Shirai et al. |
| 7,636,974 B2 | 12/2009 | Meschter et al. |
| 7,691,189 B2 | 4/2010 | En et al. |
| 8,192,815 B2 | 6/2012 | Weber et al. |
| 8,367,304 B2 | 2/2013 | Heley et al. |
| 8,379,678 B2 | 2/2013 | Zhang et al. |
| 8,379,679 B2 | 2/2013 | Zhang et al. |
| 8,451,873 B2 | 5/2013 | Zhang |
| 8,663,806 B2 | 3/2014 | Weber et al. |
| 8,761,216 B2 | 6/2014 | Zhang |
| 8,771,919 B2 | 7/2014 | Wu |
| 8,809,733 B2 | 8/2014 | Scott et al. |
| 8,842,351 B2 | 9/2014 | Lawrence et al. |
| 8,879,266 B2 | 11/2014 | Jarvis et al. |
| 8,893,975 B2 | 11/2014 | Sanford et al. |
| 8,993,921 B2 | 3/2015 | Browning et al. |
| 9,034,166 B2 | 5/2015 | Tatebe et al. |
| 9,089,932 B2 | 7/2015 | Lim |
| 9,132,510 B2 | 9/2015 | Nashner et al. |
| 9,133,559 B2 | 9/2015 | Silverman |
| 9,138,826 B2 | 9/2015 | Harrison |
| 9,173,336 B2 | 10/2015 | Bhatia |
| 9,185,835 B2 | 11/2015 | Heley et al. |
| 9,314,871 B2 | 4/2016 | Nashner et al. |
| 10,071,584 B2 | 9/2018 | Nashner et al. |
| 2001/0030002 A1 | 10/2001 | Zheng et al. |
| 2002/0058737 A1 | 5/2002 | Nishiwaki et al. |
| 2002/0097440 A1 | 7/2002 | Paricio et al. |
| 2002/0109134 A1 | 8/2002 | Iwasaki et al. |
| 2002/0130441 A1 | 9/2002 | Robinson et al. |
| 2002/0160145 A1 | 10/2002 | Bauhoff |
| 2003/0006217 A1 | 1/2003 | Dance |
| 2003/0024898 A1 | 2/2003 | Natsume et al. |
| 2003/0074814 A1 | 4/2003 | Krings et al. |
| 2003/0191223 A1 | 10/2003 | Waterkamp |
| 2003/0225189 A1 | 12/2003 | Fuller |
| 2004/0000490 A1 | 1/2004 | Chang |
| 2005/0023022 A1 | 2/2005 | Kriege et al. |
| 2005/0034301 A1 | 2/2005 | Wang |
| 2005/0115840 A1 | 6/2005 | Dolan |
| 2005/0127123 A1 | 6/2005 | Smithers |
| 2005/0158576 A1 | 7/2005 | Groll |
| 2005/0159533 A1 | 7/2005 | Nabeshima et al. |
| 2005/0263418 A1 | 12/2005 | Bastus Cortes |
| 2006/0007524 A1 | 1/2006 | Tam |
| 2006/0055084 A1 | 3/2006 | Yamaguchi et al. |
| 2006/0066771 A1 | 3/2006 | Hayano et al. |
| 2006/0105542 A1 | 5/2006 | Yoo |
| 2006/0225918 A1 | 10/2006 | Chinda et al. |
| 2007/0018817 A1 | 1/2007 | Marmaropoulos et al. |
| 2007/0045893 A1 | 3/2007 | Asthana et al. |
| 2007/0053504 A1 | 3/2007 | Sato et al. |
| 2007/0262062 A1 | 11/2007 | Guth |
| 2007/0275263 A1 | 11/2007 | Groll |
| 2008/0152859 A1 | 6/2008 | Nagal |
| 2008/0165485 A1 | 7/2008 | Zadesky et al. |
| 2008/0166007 A1 | 7/2008 | Hankey |
| 2008/0241478 A1 | 10/2008 | Costin et al. |
| 2008/0274375 A1 | 11/2008 | Ng et al. |
| 2008/0295263 A1 | 12/2008 | Meschter et al. |
| 2008/0299408 A1 | 12/2008 | Guo et al. |
| 2008/0311369 A1 | 12/2008 | Yokoyama et al. |
| 2008/0311370 A1 | 12/2008 | Yokoyama et al. |
| 2009/0017242 A1 | 1/2009 | Weber et al. |
| 2009/0019737 A1 | 1/2009 | Moreno |
| 2009/0091879 A1 | 4/2009 | Lim |
| 2009/0104949 A1 | 4/2009 | Sato et al. |
| 2009/0136723 A1 | 5/2009 | Zhao |
| 2009/0190290 A1 | 7/2009 | Lynch et al. |
| 2009/0194444 A1 | 8/2009 | Jones |
| 2009/0197116 A1 | 8/2009 | Cheng et al. |
| 2009/0236143 A1 | 9/2009 | Nakamura |
| 2009/0260871 A1 | 10/2009 | Weber et al. |
| 2009/0305168 A1 | 12/2009 | Heley et al. |
| 2009/0310470 A1 | 12/2009 | Yrjonen et al. |
| 2010/0015578 A1 | 1/2010 | Falsafi et al. |
| 2010/0061039 A1 | 3/2010 | Sanford et al. |
| 2010/0065313 A1 | 3/2010 | Takeuchi et al. |
| 2010/0159273 A1 | 6/2010 | Filson et al. |
| 2010/0159274 A1 | 6/2010 | Filson et al. |
| 2010/0183869 A1 | 7/2010 | Lin et al. |
| 2010/0209721 A1 | 8/2010 | Irikura et al. |
| 2010/0209722 A1 | 8/2010 | Irikura et al. |
| 2010/0209731 A1 | 8/2010 | Hamano |
| 2010/0294426 A1 | 11/2010 | Nashner |
| 2010/0300909 A1 | 12/2010 | Hung |
| 2011/0008618 A1 | 1/2011 | Weedlun |
| 2011/0048755 A1 | 3/2011 | Su et al. |
| 2011/0051337 A1 | 3/2011 | Weber et al. |
| 2011/0089039 A1 | 4/2011 | Nashner |
| 2011/0089067 A1 | 4/2011 | Scott et al. |
| 2011/0123737 A1 | 5/2011 | Nashner et al. |
| 2011/0186455 A1 | 8/2011 | Du et al. |
| 2011/0193928 A1 | 8/2011 | Zhang et al. |
| 2011/0193929 A1 | 8/2011 | Zhang et al. |
| 2011/0194574 A1 | 8/2011 | Zhang et al. |
| 2011/0155901 A1 | 10/2011 | Hum et al. |
| 2011/0253411 A1 | 10/2011 | Hum et al. |
| 2011/0315667 A1 | 12/2011 | Reichenback et al. |
| 2012/0043306 A1 | 2/2012 | Howerton et al. |
| 2012/0081830 A1 | 4/2012 | Yeates et al. |
| 2012/0100348 A1 | 4/2012 | Brokhyser et al. |
| 2012/0141752 A1 | 6/2012 | Wu et al. |
| 2012/0248001 A1 | 10/2012 | Nashner |
| 2012/0275130 A1 | 11/2012 | Hsu et al. |

(56) References Cited

U.S. PATENT DOCUMENTS

| | | | |
|---|---|---|---|
| 2012/0275131 A1 | 11/2012 | Hsu et al. |
| 2013/0075126 A1 | 3/2013 | Nashner et al. |
| 2013/0083500 A1 | 4/2013 | Prest et al. |
| 2013/0129986 A1 | 5/2013 | Heley et al. |
| 2014/0134429 A1 | 5/2014 | Weber et al. |
| 2014/0186654 A1 | 7/2014 | Zhang |
| 2014/0363608 A1 | 12/2014 | Russell-Clarke et al. |
| 2014/0367369 A1 | 12/2014 | Nashner et al. |
| 2014/0370325 A1 | 12/2014 | Nashner et al. |
| 2015/0093563 A1 | 4/2015 | Runge et al. |
| 2015/0132541 A1 | 5/2015 | McDonald et al. |
| 2015/0176146 A1 | 6/2015 | Browning et al. |
| 2016/0229941 A1 | 8/2016 | Kuranari et al. |
| 2018/0009200 A1 | 1/2018 | Heo et al. |
| 2018/0345708 A1 | 12/2018 | Nashner et al. |

FOREIGN PATENT DOCUMENTS

| | | |
|---|---|---|
| CN | 201044438 | 2/2008 |
| CN | 101204866 | 6/2008 |
| CN | 102173242 | 9/2011 |
| DE | 19523112 | 6/1996 |
| DE | 102005048870 | 4/2007 |
| EP | 0031463 | 7/1981 |
| EP | 0114565 | 8/1984 |
| EP | 0121150 | 10/1984 |
| EP | 0234121 | 9/1987 |
| EP | 0633585 | 1/1995 |
| EP | 0997958 | 5/2000 |
| EP | 2399740 | 12/2011 |
| EP | 2488369 | 3/2014 |
| GB | 788329 | 12/1957 |
| JP | S57149491 | 9/1982 |
| JP | H0313331 | 1/1991 |
| JP | H03138131 | 6/1991 |
| JP | H03203694 | 9/1991 |
| JP | H06126192 | 5/1994 |
| JP | H06212451 | 8/1994 |
| JP | H06320104 | 11/1994 |
| JP | H07204871 | 8/1995 |
| JP | 2000000167 | 1/2000 |
| JP | 2002370457 | 12/2002 |
| JP | 2003055794 | 2/2003 |
| JP | 2005022924 | 1/2005 |
| JP | 2006138002 | 6/2006 |
| JP | 2008060240 | 3/2008 |
| JP | 2008087409 | 4/2008 |
| JP | 2008296539 | 12/2008 |
| WO | WO 98/53451 | 11/1998 |
| WO | WO 0077883 | 12/2000 |
| WO | WO 01/15916 | 3/2001 |
| WO | WO 01/34408 | 5/2001 |
| WO | WO 2006/124279 | 11/2006 |
| WO | WO 2007/088233 | 8/2007 |
| WO | WO 2008/092949 | 8/2008 |
| WO | WO 2009/051218 | 4/2009 |
| WO | WO 2010/095747 | 8/2010 |
| WO | WO 2010/111798 | 10/2010 |
| WO | WO 2010/135415 | 11/2010 |
| WO | WO 2011/047325 | 4/2011 |

OTHER PUBLICATIONS

Author Unknown, "The SciCron Technologies," https://www.sctech.com/sp-09-pencil-hardness, 2022.
Author Unknown, "The Kronos 2310 Product Datasheet," https://kronostio2.com/en/components/idownloads/send/49-kronos-2310, 2022.
Chang, "Lasers Make Other Metals Look Like Gold," New York Times, nytimes.com, 2 pgs., Jan. 31, 2008.
Hajdu, "Chapter 7," William Andrew Publishing from www.knovel.com, pp. 193-206, 1990.
Shah,Vishu, Handbook of Plastics Testing and Failure Analysis, John Wiley & Sons, Inc., Third Edition, Jun. 14, 2006.
"Database EPI" Week 201107 Thomas Scientific, London, GB; An 2010-Q46184, 1 page, Nov. 17, 2010.
"Marking Lasers: Marking without Limitations", Trumpf Inc., pp. 1-36, Sep. 10, 2007.
"Thermal Shock Resistant Conformal Coating", Product Data Sheet, Dymax Corporation, pp. 1-2., Jul. 9, 2007.
"UV-Curing Sheet Adhesives", ThreeBond Technical News, 8 pages, Issued Jul. 1, 2009.
International Search Report for International Patent Application No. PCT/US2013/046427, dated Jul. 30, 2013.
Written Opinion for International Patent Application No. PCT/US2013/046427, dated Jul. 30, 2013.

LASER-MARKED ELECTRONIC DEVICE HOUSINGS

CROSS-REFERENCE TO RELATED APPLICATION(S)

This application is a nonprovisional application of and claims the benefit of U.S. Provisional Patent Application No. 63/248,271, filed Sep. 24, 2021 and titled "Laser-Marked Electronic Device Housings," the disclosure of which is hereby incorporated herein by reference in its entirety.

FIELD

The described embodiments relate generally to laser-formed markings on electronic device housings. More particularly, the present embodiments relate to laser-formed images and other laser-formed markings comprising multiple pixels formed in a surface region of the housing.

BACKGROUND

Electronic devices generally include a housing or other exterior component that may be marked or printed. Some traditional printing techniques apply ink or paint to the housing to produce a marking. However, markings formed from ink or paint may be subject to wear as the device is handled.

Embodiments described herein are directed to markings for electronic devices that may have advantages as compared to markings produced by some traditional printing techniques.

SUMMARY

Embodiments described herein relate to laser-formed markings on exterior surfaces of electronic device housings. The markings may be formed in surface regions of the housings and in some cases are grayscale images. Electronic devices including the laser-marked housings and techniques for laser-marking the housings are also described herein.

In some cases, the marking comprises one or more laser-formed pixels formed in a surface region of the housing. In embodiments, the housing includes a laser-modifiable material, and each laser-formed pixel comprises laser-modified material. In embodiments, the laser-formed pixels are configured to produce visual contrast with a surface region of the housing which has not been substantially laser-modified. In some cases, a laser-formed pixel may be configured to appear darker than a surface region of the housing which has not been laser-modified. In embodiments, the laser-modifiable material comprises a polymer and a pigment dispersed within the polymer.

In embodiments, one or more portions of the marking have a color which is visually distinct from that of another surface region of the housing. In some cases, the laser-formed pixels are configured so that the one or more portions of the marking have a lightness value that produces a dark appearance without giving an undesirable roughness, gloss level, and/or yellow cast to the marking, as explained in more detail below. In embodiments, the color of a portion of the marking depends in part on the density of the laser-formed pixels in that portion. In some cases, different portions of the marking have different densities of laser-formed pixels and the different densities of laser-formed pixels produce different lightness values in the different portions of the marking.

One or more portions of the marking may have a surface roughness different from that of a surface region of the housing which has not been substantially laser-modified. However, the one or more portions of the marking may be configured to have a surface roughness that does not feel overly rough when a user moves a finger over the marking. In some cases, the differences in surface roughness may be sufficiently small that these portions of the marking have a similar tactile "feel" to that of a surface region of the housing which has not been substantially laser-modified.

In some embodiments, each laser-formed pixel defines a surface feature along the exterior surface of the housing. In some cases, these surface features define high points or peaks of the surface, as explained in more detail below and shown in FIG. 3. When pixels of an array of laser-formed pixels overlap, the surface features may also overlap, but each pixel of the array may define a peak. However, the laser-formed pixels may be configured so that the surface features are not individually perceptible to a user and so that the surface features do not produce an overly rough feel when a user moves a finger over the marking. As examples, the average height of the surface features may be in the range from 0.2 microns to 0.75 microns, from 0.2 microns to 0.5 microns, from 0.5 microns to 1.0 micron, from 1.0 micron to 1.5 microns, or from 1.0 micron to 2.0 microns to achieve these effects. As additional examples, the surface features may have an arithmetical mean height less than 0.75 microns, less than 0.5 microns, less than 0.4 microns, less than 0.3 microns, less than 0.2 microns, or less than 0.1 microns. Additional suitable ranges for height parameters are described with respect to FIG. 3 and that description is not repeated here.

One or more portions of the marking may have a gloss value different from that of a surface region of the housing which has not been laser-modified. However, the laser-formed pixels may be configured to minimize this difference in gloss value. For example, the surface features defined by the laser-formed pixels may be configured to minimize the difference in gloss value. In some cases, the difference in gloss value may be less than 90 gloss units, less than 85 gloss units, less than 80 gloss units, less than 70 gloss units, less than 60 gloss units, or less than 55 gloss units as measured at 60 degrees.

The disclosure provides a housing for an electronic device, the housing comprising a housing member comprising a polymer and a pigment dispersed within the polymer. The housing member defines a marking formed in a first surface region of the housing member, the marking defined, at least in part, by an array of laser-formed pixels. A portion of the marking has a first lightness value L* ranging from 40 to 65 and an arithmetical mean height ranging from 0.01 microns to 0.5 microns. A second surface region of the housing member, at least partially surrounding the marking, has a second lightness value L* ranging from 80 to 100 and a b* value less than 4 and greater than −10.

The disclosure also provides a housing comprising a housing member defining an exterior surface and comprising a housing material and a marking formed in a first region of the exterior surface and defining an image. The marking comprises an array of laser-formed pixels formed within the housing material, each laser-formed pixel of the array of laser-formed pixels having a diameter from 10 microns to 20 microns. A first portion of the marking has a minimum center to center spacing between adjacent laser-formed pixels of the array of laser-formed pixels, a ratio of the minimum center to center spacing to the diameter ranging from 0.5 to 0.9, a first lightness value L* ranging from 45 to 65, and a first b* value greater than −7 and less than 0. A second region of the exterior surface at least partially surrounding the image has a second lightness value L* ranging from 95 to 100 and a second b* value greater than −7 and less than 0.

The disclosure further provides an electronic device comprising a housing defining an interior volume, a battery positioned within the interior volume, and electronic circuitry positioned within the interior volume and operably coupled to the battery. The housing comprises a marking formed in a first surface region of the housing and defining an image; the marking comprising laser-formed pixels formed within a housing material. A portion of the marking has a pixel density ranging from 90% to 100%, a first lightness value L* ranging from 40 to 65, and a first gloss value ranging from 10 gloss units to less than 50 gloss units as measured at 60 degrees. The housing also comprises a second surface region adjacent to the first surface region and having a second lightness value L* ranging from 80 to 100 and a second gloss value ranging from 90 gloss units to 100 gloss units as measured at 60 degrees.

BRIEF DESCRIPTION OF THE DRAWINGS

The disclosure will be readily understood by the following detailed description in conjunction with the accompanying drawings, wherein like reference numerals designate like elements.

Figure 1:
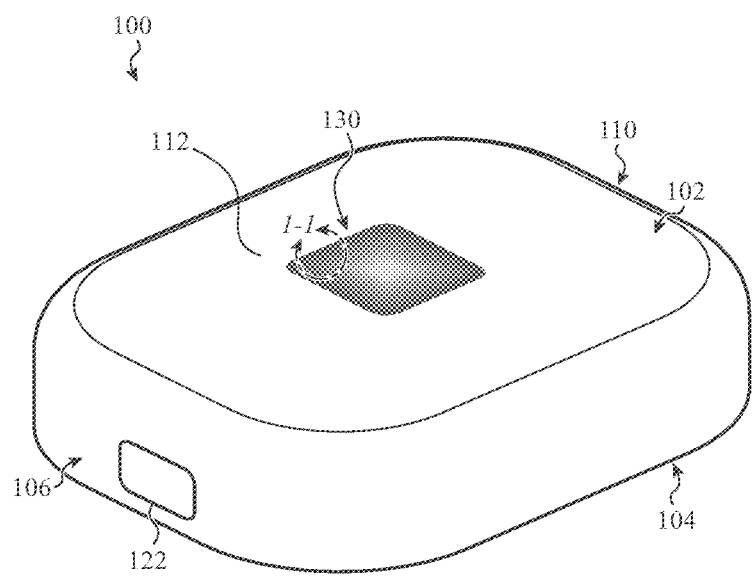
FIG. 1 shows an example device including a laser-formed marking.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Reference will now be made in detail to representative embodiments illustrated in the accompanying drawings. It should be understood that the following descriptions are not intended to limit the embodiments to one preferred implementation. To the contrary, the described embodiments are intended to cover alternatives, modifications, and equivalents as can be included within the spirit and scope of the disclosure and as defined by the appended claims.

The following disclosure relates to laser-formed markings on exterior surfaces of electronic device housings. The markings may be formed in surface regions of the housing and in some cases the markings produce an image, such as a grayscale image. Electronic devices including the laser-marked housings and techniques for laser-marking the housings are also described herein.

In some cases, the marking comprises one or more localized elements. In embodiments, the housing includes a laser-modifiable material, and the marking comprises one or localized elements comprising laser-modified material. Each localized element may define a laser-formed pixel of the marking. In embodiments, the laser-formed pixels are configured to produce visual contrast with a surface region of the housing which has not been laser-modified. In some cases, a laser-formed pixel may be configured to appear darker than a surface region of the housing which has not been laser-modified.

In embodiments, the laser-modifiable material comprises a polymer and a pigment dispersed within the polymer. The laser-modifiable material may define an exterior surface of the housing. The laser-modifiable material may extend from an exterior surface to an interior surface of the housing, rather than being a surface coating or film of laser-modifiable material coupled to the exterior surface of the housing. For example, the housing may be formed from the laser-modifiable material. In some cases, laser-forming of the pixel may modify the polymer, the pigment, or both.

In some cases, the marking comprises multiple pixels, at least some of which are laser-formed pixels. In some embodiments, different portions of the marking have different densities of laser-formed pixels and the different densities of laser-formed pixels produce different lightness values in the different portions of the marking. In some cases, the laser-formed pixels are configured so that the one or more portions of the marking have a lightness value that produces a dark appearance without giving an undesirable roughness, gloss level, and/or yellow cast to the marking. For example, the laser-formed pixels of the marking may be configured so that the marking has a tactile "feel" that is not overly rough. As an additional example, the laser-formed pixels of the markings described herein may be configured so that the marking has a gloss value that is similar enough to the gloss value of an unmarked surface of the housing that the difference in gloss values is not readily detectable. As a further example, the laser-formed pixels of the markings described herein may be configured so that the marking has the desired lightness values without unduly increasing a b* value of the marking over that of the rest of the housing and giving a yellow cast to the marking. The additional description provided below with respect to suitable roughness, gloss levels, and color values is generally applicable herein and is not repeated here.

One or more portions of the marking may have a surface roughness different from that of a surface region of the housing which has not been laser-modified. For example, the process of laser-forming the pixels may tend to increase the roughness of the surface of the housing. The tendency for the process to increase the roughness of the housing may increase with decreasing lightness and/or depth of the marking. As previously discussed, the one or more portions of the markings described herein may be configured to have a surface roughness that does not feel overly rough when a user moves a finger over the marking. In some cases, the differences in surface roughness may be sufficiently small that these portions of the marking have a tactile "feel" that is sufficiently similar to that of an unmodified surface region of the housing that the difference is not readily detectable. The markings described herein may extend sufficiently deep into the housing to provide a durable marking that is not readily removed by abrasion of the housing.

In some embodiments, each laser-formed pixel defines a surface feature along the exterior surface of the housing. In some cases, these surface features define high points or peaks of the surface, as explained in more detail below and shown in FIG. 3. When pixels of an array of laser-formed pixels overlap, the surface features may also overlap, but each pixel of the array may define a peak. However, the laser-formed pixels may be configured so that the surface features are not individually perceptible to a user and so that the surface features do not produce an overly rough feel when a user moves a finger over the marking. As examples, an average height of the surface features may be in the range from 0.20 microns (i.e., micrometers) to 0.75 microns, from 0.2 microns to 0.5 microns, from 0.5 microns to 1.0 microns, from 1.0 micron to 1.5 microns, or from 1.0 micron to 2.0 microns to achieve these results. As additional examples, the surface features may have an arithmetical mean height (Sa) less than 0.75 microns, less than 0.5 microns, less than 0.4 microns, less than 0.3 microns, or less than 0.2 microns. Additional suitable ranges for height parameters are described with respect to FIG. 3 and not repeated here. The average height and/or arithmetical mean height may depend on the density of the pixels, with greater pixel density producing greater peak heights.

One or more portions of the marking may have a gloss value different from that of a surface region of the housing which has not been laser-modified. In some cases, the process of laser-forming the pixels may tend to decrease the gloss level of the housing surface. The changes in the gloss level may be due at least in part to the changes in the roughness level of the housing. For example, a portion of the marking having a relatively high density of laser-formed pixels may have a lower gloss value than the other surface region of the housing. However, the laser-formed pixels may be configured to minimize this difference in gloss value. For example, the surface features defined by the laser-formed pixels may be configured to minimize the difference in gloss value. In some cases, the difference in gloss value may be less than 90 gloss units, less than 85 gloss units, less than 80 gloss units, less than 70 gloss units, less than 60 gloss units, or less than 55 gloss units (as measured at 60 degrees).

The techniques described herein can provide a laser-formed marking which has a color which is visually distinct from that of another surface region of the housing. The other surface region of the housing may at least partially surround the marking. The laser-formed marking may be substantially indistinguishable from the other surface region of the housing in terms of tactile properties. In some embodiments, the marking may be configured so that a gloss difference is minimized between a portion of the marking having a relatively high density of laser-formed pixels and the other portion of the housing.

In embodiments, the marking defines one or more of an image, a letter, a number, a serial identification, a 1D bar code, a 2D bar code, or other encoded information regions. The image may be a digital image. The digital image may represent a logo, a photographic image, a drawing, and the like. In some cases, the digital image may represent a non-digital image. The marking may have a particular resolution, such as a minimum spacing between laser-formed pixels. In some examples, when viewed at a typical viewing distance (e.g., greater than about 15 cm or greater than about 30 cm) the individual pixels of the marking may be difficult or impossible to distinguish with the unaided eye. Suitable spacings between the laser-formed pixels are discussed with respect to FIG. 4 and that discussion is not repeated here.

In some embodiments, the marking includes a grayscale image. In some examples, the grayscale image appears to be continuous regions of light and dark and individual pixels may be difficult or impossible to perceive with the unaided eye at a typical viewing distance. The grayscale image typically includes at least two portions having different levels of darkness. Additional features of grayscale images suitable for markings disclosed herein are described with respect to FIG. 1 and that description is not repeated here.

These and other embodiments are discussed below with reference to FIGS. 1-7. However, those skilled in the art will readily appreciate that the detailed description given herein with respect to these figures is for explanatory purposes only and should not be construed as limiting.

FIG. 1 depicts a simplified example of an electronic device. As shown in FIG. 1, the electronic device 100 includes a housing 110 having a front surface 102 on which a marking 130 has been formed. In the example of FIG. 1, the marking 130 defines a grayscale marking. The placement of the marking 130 on the surface 102 is for illustration purposes only and is merely an example. Markings, as described herein, may be placed on any suitable surface of an electronic device housing, including the rear surface 104, the side surface 106, or curved surface regions of the housing 110.

The electronic device 100 (also referred to simply as a device) may be a portable electronic device or other suitable electronic device. In some embodiments, the electronic device 100 may be a mobile telephone, a notebook computing device (e.g., a notebook), a tablet computing device (e.g., a tablet), a portable media player, a wearable device, or another type of portable electronic device. As additional examples, the portable electronic device may be a wristwatch, a media player, a camera, a headphone device, an earpiece device, a remote control, an identifier (e.g., a card), computer component, input device, a charging device, or virtually any other type of electronic product or device component.

Figure 2:
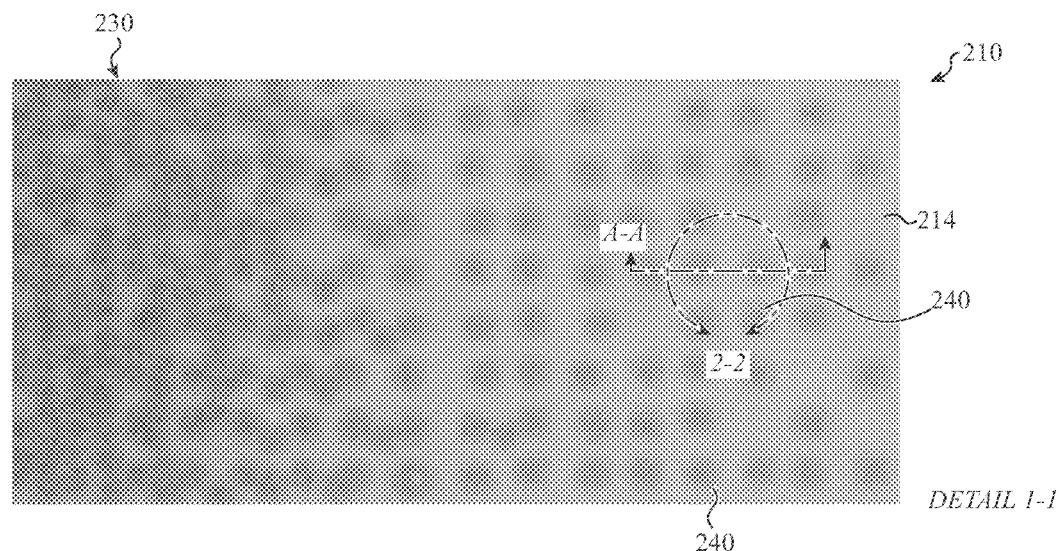
FIG. 2 shows an example detail view of a laser-formed marking.

As shown in FIG. 1, the marking 130 defines an image. In embodiments described herein, the marking comprises a plurality of localized elements. These localized marking elements can form pixels of the image. In embodiments described herein, at least some of the localized marking elements include laser-modified housing material and may therefore be referred to as laser-formed pixels. In some embodiments, the marking 130 may comprise an array of laser-formed pixels, as illustrated in FIG. 2. The marking may also include regions of housing material (e.g., 112) which have not been laser-modified or which have been laser-modified to only a minimal extent. Regions of the housing material which have not been substantially laser-modified may have a color, gloss and/or roughness value that is substantially similar to that of the housing material prior to the laser marking process.

In some cases, the localized marking elements (e.g., the laser-formed pixels) may be configured to appear darker than a region of the housing which has not been substantially laser-modified. In some embodiments, different portions of the marking have different densities of laser-formed pixels and the different densities of laser-formed pixels produce different lightness values for the different portions of the marking. As example, a portion of the marking having a higher density of laser-formed pixels may have a lower lightness value than another portion of the marking having a lower density of laser-formed pixels. The density of laser-formed pixels may also be referred to herein as a pixel density. In some embodiments, the density of the laser-formed pixels may be quantified by the percentage of the surface area associated with the pixels. In additional embodiments, the density of the laser-formed pixels may be quantified by a grid density, as described in more detail with respect to FIG. 4.

At least some of the laser-formed pixels may be sized so that they are not visually discernable as individual pixels at a particular viewing distance. As a result, a given portion of the marking may appear to be continuous rather than formed of discrete pixels as viewed from a typical viewing distance. At least some of the laser-formed pixels may also be configured so that any surface features associated with the pixels are not discernable by "feel," as discussed in greater detail with respect to FIGS. 2-5. Additional description of the dimensions and other properties of laser-formed pixels is provided with respect to FIGS. 2-5 and that description is generally applicable herein.

In embodiments described herein, the marking 130 may define a substantially monochromatic image. In some examples, the localized marking elements (e.g., pixels) are substantially uniform in color and the apparent color of a given portion of the marking is due to the density of the pixels, the color of the pixels, and the (background) color of the housing. In additional examples, the size and/or the color of the laser-formed pixels may be varied by adjusting the laser parameters during the process of forming the marking.

In some cases, the marking 130 may define or include a grayscale marking. The grayscale marking may include a least two portions having different lightness values. The grayscale image may also include at least one gradient portion that provides a transition between the at least two portions having different gray levels (e.g., levels of darkness or lightness). In additional cases, the grayscale marking may include more than two different gray levels, such as three or more or four or more gray levels. A grayscale image may be a digital image that represents a photographic image or a drawing. In some cases, a digital grayscale image may appear substantially visually identical to a non-digital source image. In additional cases, the grayscale image is a representation of a computer-graphics image that is typically displayed as a set of display pixels.

The laser-formed pixel may be formed in a laser-modifiable material included in the housing. This material may also be referred to herein as a laser-modifiable housing material or more simply as a housing material or as a material. In some cases, the laser-modifiable housing material defines an external surface, and the laser-formed pixel is formed within a region of the external surface. The laser-modifiable housing material may also extend through a thickness of the housing to define an internal surface of the housing. The laser-modifiable housing material may be provided in the housing as a whole or in one or more members of the housing. In some cases, the housing or housing member in which the marking is formed may be referred to herein as a substrate in which the marking is formed.

In embodiments, the laser-modifiable material comprises a polymer and a pigment dispersed in the polymer. The polymer may form a matrix for the particles of the pigment. In some cases, the pigment comprises a metal oxide such as a titanium oxide (e.g., titanium dioxide). The polymer may comprise one or more of more of polycarbonate (PC), acrylonitrile butadiene styrene (ABS), and the like. The laser-formed pixels described herein are formed by exposing the laser-modifiable material to one or more pulses from a laser, thereby modifying the laser-modifiable material. Without wishing to be bound by any particular belief, the laser-modifiable material may be modified by one or more of laser-modification of the polymer, laser-modification of the pigment (e.g., change in surface crystal structure and/or composition such as through oxidation or doping), or laser-induced reaction between the polymer and the pigment. As previously discussed, in some embodiments a laser-formed pixel may be configured to appear darker than a surface region of the housing which has not been substantially modified by the laser marking process (e.g., has not been modified or has been modified to only a minimal extent by the laser process). Alternately or additionally, the laser-modifiable material may include a modifying agent other than the pigments described above. Additional description of methods for producing the laser-formed pixels described herein is provided below and that description is generally applicable herein.

In the example of FIG. 1, the housing 110 defines an opening 122. In some cases, the opening 122 may provide a port for charging the electronic device. In additional examples, the housing may define one or more openings for internal components that receive input and/or produce output. In aspects of the disclosure, the electronic device 100 includes one or more electronic components. In some cases, the electronic device may include one or more of a processor, electronic circuitry (e.g., control circuitry), a sensor, memory, and a battery. More generally, the electronic components may be any of those discussed with respect to FIG. 7 and that description is not repeated here. The housing 100 may define an interior volume configured to receive one or more of the electronic components, such as a battery and electronic circuitry (as shown in FIG. 6B).

FIG. 2 shows an example detail view of a marking. In the example of FIG. 2, a portion of a marking 230 has been enlarged to show individual laser-formed pixels 240. FIG. 2 provides a magnified top view of laser-formed pixels that is similar to a view obtained using an optical microscope. The marking 230 is formed on the housing 210 and may have features similar to those of the marking 130 in detail view 1-1. FIG. 2 also shows a portion 214 of the housing which has been modified to a lesser extent by the laser process than the laser-formed pixels 240 (e.g., modified to only a minimal extent).

Figure 4:
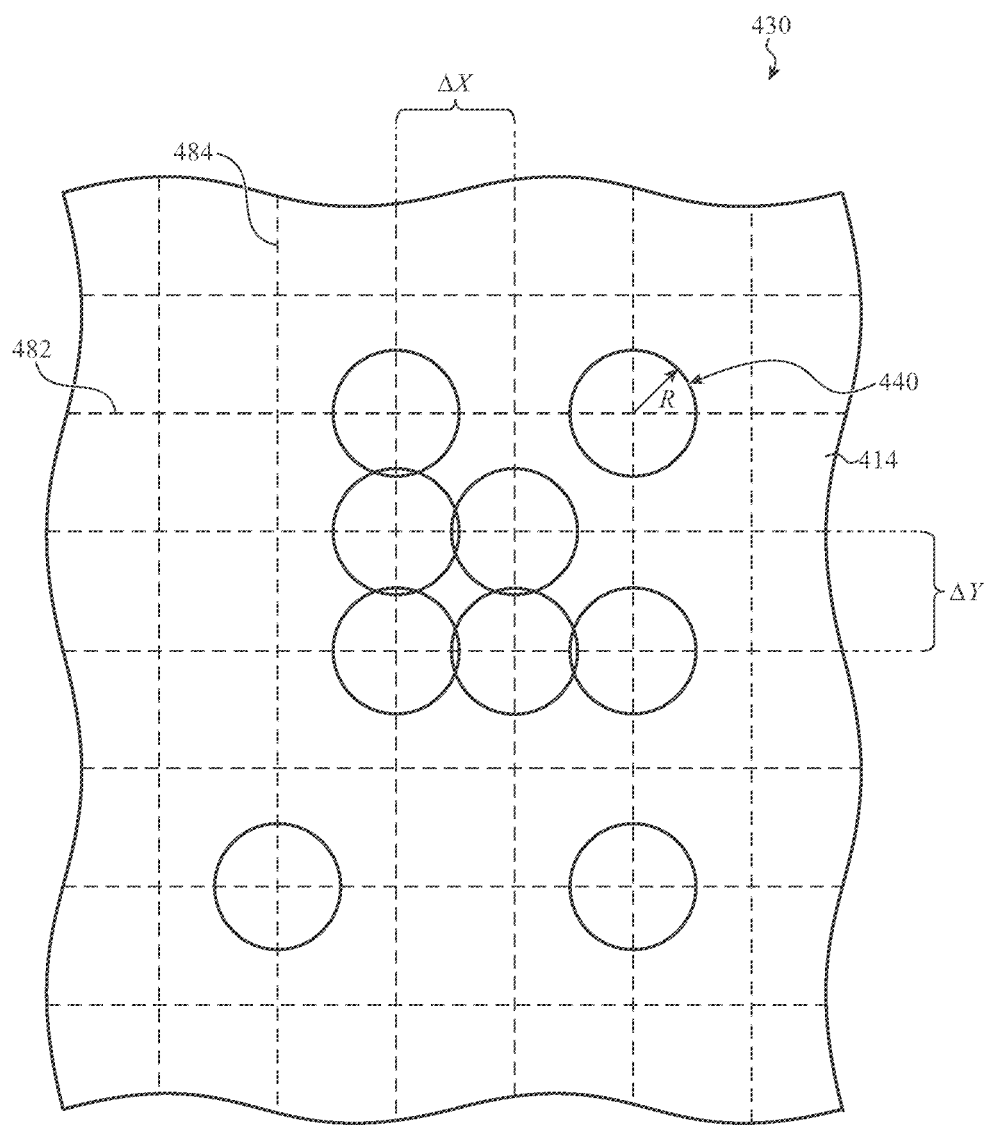
FIG. 4 shows an example of laser-formed pixels produced using a raster pattern.

The portion of the marking 230 shown in FIG. 2 includes an array of laser-formed pixels 240. In some cases, the laser-formed pixels are distributed along a raster pattern, as discussed in more detail with respect to FIG. 4. In the example of FIG. 2, the spacing between the laser-formed pixels of the array varies from left to right and is generally greater to the right in FIG. 2. Neighboring laser-formed pixels that do not overlap and are separated from each other are shown to the right in FIG. 2. Neighboring laser-formed pixels that abut or overlap each other are shown to the left in FIG. 2. The density of the laser-formed pixels also varies from left to right and is generally lower to the right in FIG. 2. In some cases, the density of the laser-formed pixels may be quantified by a grid density, as explained further with respect to FIG. 4. The description provided with respect to FIG. 4 is generally applicable herein and is not repeated here. In some embodiments, the laser-formed pixels within a given marking are substantially uniform in dimensions (e.g., diameter, depth) and in color (e.g., L*, A*, b* values).

As shown in FIG. 2, the laser-formed pixels are configured so that they are darker than surface regions of the housing which have not been substantially modified by the laser marking process (e.g., the surface region 112 of FIG. 1). The laser-formed pixels may also be darker than portions of the housing which have been laser-modified to a lesser extent (e.g., portion 214). When the pixels are small, the color of a portion of the marking is typically measured rather than the color of individual pixels. In some cases, the size of the laser-formed pixels is too small to allow ready measurement of the color of individual pixels. In addition, the color of the portion of the marking is often influenced by the density of laser-formed pixels in the portion of the marking in addition to the color of the individual pixels. In some embodiments, the density of the laser-formed pixels may be quantified by the percentage of the surface area associated with the pixels or by a grid density as described further with respect to FIG. 4.

In some cases, both the color of the surface region including the marking (and portions thereof) and the color of a region of the housing which has not been substantially modified by the laser marking process may be characterized by coordinates in CIEL*a*b* (CIELAB) color space. In CIEL*a*b* (CIELAB) color space, L* represents lightness (or brightness), a* the position between red/magenta and green, and b* the position between yellow and blue. The CIELAB coordinates for a given illuminant can be measured with a device such as a colorimeter or a spectrophotometer using standard measurement techniques. In some cases, the color may be measured using a Konica Minolta CF-300 spectrophotometer F2/10°, SCI (specular component included). The measurement area for this system may be 0.75 mm by 1 mm.

In embodiments, at least some portions of the marking formed in a first surface region of the housing have a color which is darker than that a second surface region of the housing which has not been substantially modified by the laser marking process. The second surface region may be adjacent and/or may at least partially surround the first surface region. In embodiments, a region of the housing which has not been substantially modified by the laser marking process has an L* value ranging from 80 to 100, from 85 to 100, or from 90 to 100. This region may also have a b* value greater than −10 and less than 4, greater than −10 and less than 2, greater than −7 and less than zero, greater than −7 and less than −1, greater than −7 and less than −2.5, greater than −5 and less than 0, greater than −5 and less than −1, greater than −5 and less than −2, or greater than −5 and less than −3. This region may also have an a* value ranging from 0 to 1.

In some cases, a portion of the marking having a density of laser-formed pixels from 90% and 100% has a L* value ranging from 40 to 70, from 40 to 65, from 45 to 65, from 45 to 60, or from 45 to 55. This portion of the marking may also have a b* value greater than −7 and less than zero, greater than −7 and less than or equal to −2.0, or greater than or equal to −6 and less than or equal to −2.5. This region may also have an a* value ranging from −1.3 to −0.5. In some cases, the difference in L* values between the portion of the marking and the other region of the housing is from 30 to 50, from 35 to 50, or from 35 to 50. In some cases, the b* values of the portion of the marking and the other region are similar, with a magnitude of the difference between the b* values being less than or equal to 1.5 or less than or equal to 1. The CIELAB coordinates may be measured using techniques similar to those previously described.

In additional embodiments, at least some portions of the laser-formed marking have a gloss value which is lower than that of another surface region of the housing which has not been substantially modified by the laser marking process. In some cases, a portion of the marking having a greater density of laser-formed pixels may tend to have a lower gloss value. In additional cases, the laser-formed pixels are configured to minimize the difference in gloss values between the portion of the marking and another surface region of the housing which has not been substantially modified by the laser marking process. For example, surface features defined by the laser-formed pixels may be configured to minimize the difference in gloss values. In some examples, a surface region of the housing which has not been substantially modified by the laser marking process has a gloss value from 80 to 100, from 85 to 100, from 90 to 100 or from 95 to 100 as measured at 60 degrees. A portion of the marking having a density of laser-formed pixels from 90% and 100% may have a gloss value greater than 7 gloss units and less than or equal to 70 gloss units, greater than 10 gloss units and less than or equal to 70 gloss units, greater than 20 gloss units and less than or equal to 70 gloss units, greater than 30 gloss units and less than or equal to 65 gloss units, greater than 7 gloss units and less than or equal to 55 gloss units, greater than 10 gloss units and less than or equal to 55 gloss units, greater than 20 gloss units and less than or equal to 55 gloss units, greater than 30 gloss units and less than or equal to 50 gloss units, or greater than 40 gloss units and less than or equal to 55 gloss units as measured at 60 degrees. The gloss difference may be less than 90 gloss units, less than 85 gloss units, less than 80 gloss units, less than 70 gloss units, less than 60 gloss units, or less than 55 gloss units. In some cases, the gloss of a surface may be measured using commercially available equipment and according to ASTM or ISO standard test methods. For example, the gloss measurement may be made with a Zehntner ZGM 1120 glossmeter at 60 degrees. The angle measurement may refer to the angle between the incident light and the perpendicular to the surface. In some cases, a gloss measurement may be made at two different orientations of the measuring device with respect to the surface and the resulting measurements averaged. For example, one gloss measurement may be made along a first orientation (e.g., along an x-axis) and the other gloss measurement may be made along a second orientation substantially orthogonal to the first orientation (e.g., along a y-axis).

As shown in the top view of FIG. 2, the laser-formed pixels 240 define a generally circular outline at the surface of the housing. In additional embodiments, the laser-formed pixels may define an outline that is circular, elliptical, rectangular, square, other suitable shapes, or combinations thereof. In some embodiments, the laser-formed pixels may have a lateral dimension, such as a diameter, ranging from 10 microns to 20 microns, or from 10 microns to 18 microns. Additional geometric features of the laser-formed pixels are discussed with respect to the cross-sectional review of FIG. 3 and the description provided with respect to FIG. 3 is generally applicable herein.

Figure 3:
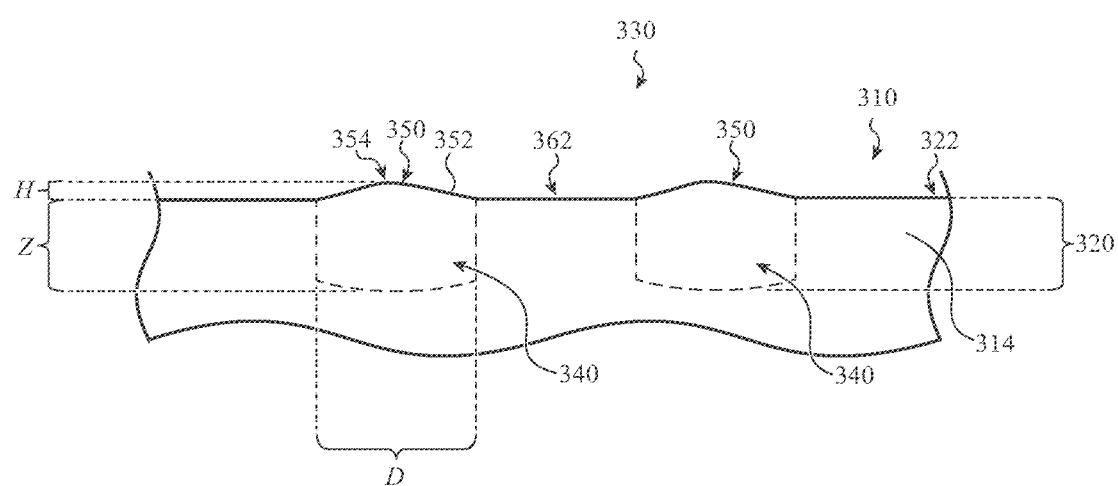
FIG. 3 shows an example of a partial cross-sectional view through a portion of a laser-formed marking.

FIG. 3 shows an example of a partial cross-sectional view of a portion of a laser-formed marking. The marking 330 includes laser-formed pixels 340 formed within a surface region 320 of the housing. As shown in FIG. 3, the surface region 320 also includes a portion 314 which has been modified to a lesser extent by the laser process (e.g., modified to only a minimal extent). The cross-section may be along A-A in the detail region 1-1 of FIG. 2.

In FIG. 3, boundaries of the laser-formed pixels 340 are schematically illustrated with dashed lines. In the example of FIG. 3, the laser-formed pixels 340 define surface features 350, which protrude with respect to a base surface 322 defined by the housing 310. For example, the base surface 322 may be defined by a region of the housing that has not been substantially laser-modified. The surface feature 350 defines a surface 352 and a top 354. The tops 354 may define high points or peaks of the surface features.

The distance between the top 354 and the base surface 322 defines a height H of the surface features. The maximum height of the surface features may be micron-sized or less, which may contribute to a smooth feel of the marking. In some cases, a maximum height of the surface features is greater than zero and less than 5 microns, greater than zero and less than 3 microns, greater than zero and less than 2 microns, greater than zero and less than 1.5 microns, greater than zero and less than 1.25 microns, greater than zero and less than 1 micron, or greater than zero and less than 0.5 microns. In some cases, the height of the surface features, which may also be referred to herein as a peak height, ranges from 0.2 microns to 1.5 microns, from 0.2 microns to 1.25 microns, from 0.2 microns to 1.0 microns, from 0.3 microns to 1.5 microns, from 0.5 microns to 2 microns, or from 1 micron to 3 microns. In some cases, the average height of the surface features may be in the range from 0.2 microns to 0.75 microns, from 0.2 microns to 0.5 microns, from 0.5 microns to 1 micron, from 1.0 micron to 1.5 microns, from 1 micron to 2 microns, or from 1 micron to 3 microns. The height of the surface features with respect to the base surface (or another reference surface) may be determined from profilometer measurements. The average height and/or arithmetical mean height may depend on the density of the pixels, with greater pixel density producing greater peak heights.

In some cases, the tops of the surface features may be at about the same height, which may further contribute to the smooth feel of the marking. For example, in some examples the mean difference between the heights of the tops of the surface features may range from 0.1 microns to 0.5 microns or from 0.1 microns to 0.3 microns. The difference between the peak heights may be determined from a line profile measurement. For example, the difference between the peak heights may be determined by taking the difference of each peak height to all the other peak heights or by determining the running difference in the peak heights along the line.

In the simplified example of FIG. 3, an interstitial surface 362 between the surface features 350 is positioned at about the same height as the base surface 322. However, the example of FIG. 3 is not limiting and in additional examples all or part of the interstitial surface 362 may be positioned below the level of the base surface. For example, the interstitial surface may define a concave shape.

In embodiments, the surface features 350 at least partially define a surface roughness of the marking. In some cases, the surface roughness may be described in terms of two-dimensional roughness parameters, including amplitude parameters such as Ra (arithmetical mean height) and Rq (root mean square roughness). In additional cases the surface roughness of the marking may be described in terms of areal surface texture parameters such as amplitude parameters, spatial parameters, and hybrid parameters. In these areal surface roughness measurements, the peaks may include the tops (354) of the surface features and the valleys may include the interstitial surfaces (e.g., 362). In some cases, the surface features may have an arithmetical mean height (e.g., Sa) less than 0.75 microns, less than 0.5 microns, less than 0.4 microns, less than 0.3 microns, less than 0.2 microns, or less than 0.1 microns. In some examples, the arithmetical mean height (e.g., Sa) may be from 0.01 microns to 0.5 microns, from 0.025 microns to 0.45 microns, from 0.01 microns to 0.3 microns, from 0.01 microns to 0.2 microns, or from 0.01 microns to 0.1 microns. In some cases, the surface features may have a root mean square height (e.g., Sq) less than 0.5 microns, from 0.1 microns to 0.5 microns, or from 0.02 microns to 0.2 microns.

Surface filtering may be used to exclude surface noise and/or surface waviness before determining the surface texture parameters. For example, a form filter may be used along with a $\lambda_s$ and a $\lambda_c$ filter. In some cases, a segmentation technique may be used to determine feature parameters such as the maximum diameter, the minimum diameter, the area, and the perimeter. These parameters may be calculated on the basis of the feature shape as projected onto the reference surface (e.g., a reference plane). Mean values may be determined for a given class of surface features (e.g., hills or valleys). Surface texture parameters and methods for determining these parameters (including filtering and segmentation) are described in more detail in International Organization for Standardization (ISO) standard 25178 (Geometric Product Specifications (GPS)—Surface texture: Areal). Surface texture parameters may be measured using commercially available equipment such as a Keyence roughness measurement microscope (e.g., a laser scanning confocal microscope), a Zygo surface measuring device (e.g., a laser interferometer), or a Sensofar optical profiler (e.g., at 20×).

A surface region which has not been substantially laser-modified typically has a roughness less than that of the surface region 320 defining the marking 330. The surface region which has not been substantially laser-modified may at least partially surround the marking 330, as previously shown in FIG. 1. In some embodiments, a surface region which has not been substantially laser-modified may have a texture corresponding to that of a polished surface. In other embodiments, the surface region which has not been substantially laser-modified may have a slightly rougher surface texture. Both this surface region and the surface region defining the marking may feel smooth to the touch.

FIG. 3 also schematically shows the diameter D and the depth Z of the laser-formed pixels 340. In some embodiments, the laser-formed pixels 340 have a depth Z from 3 microns to 15 microns, from 3 microns to 10 microns, from 1 micron to 5 microns, or from 5 microns to 15 microns. As previously discussed, the laser-formed pixels 340 may have a diameter D ranging from 10 microns to 20 microns, or from 10 microns to 18 microns. The diameter of the laser-formed pixels and the height of the pixels can influence the tactile "feel" of the marking and may be configured to produce a suitably smooth feel to the marking while providing the desired optical effects to the marking.

The disclosure also provides methods for forming a marking along an exterior surface of a housing. The marking may include an image as previously described. The method may include an operation of obtaining a housing comprising a laser-modifiable material. In embodiments, the laser-modifiable material comprises a polymer and a pigment dispersed within the polymer. The laser-modifiable material may be similar in composition to the laser-modifiable materials previously discussed with respect to FIGS. 1 and 2 and that discussion is generally applicable herein.

The method may further include an operation of using a laser to form the marking comprising an array of laser-formed pixels of laser-modified material within the housing. As referred to herein, a laser-formed pixel is defined by a localized surface region including laser-modified material, with the laser-modified material formed by one or more laser pulses at a particular location. In some embodiments, a laser-formed pixel may be configured to appear darker than a surface region of the housing which has not been modified as previously discussed with respect to FIGS. 1 and 2. The geometry and other features of the laser-formed pixels may be as previously discussed with respect to FIGS. 1-3 and that discussion is not repeated here.

During the operation of using a laser to form the marking, the laser beam may be scanned along one more paths on the housing while a sequence of pulses is emitted from the laser. The one or more paths may form a scan pattern with respect to the surface of the housing. In some embodiments, the scan pattern is a raster pattern comprising a series of linear paths spaced apart from one another. Other types of scan patterns include, but are not limited to serpentine patterns, spiral patterns, and the like. The operation of using the laser to form the marking may be a half-toning operation that employs varies the color (e.g., gray-level) of the marking by varying the spacing of the laser-formed pixels, as described in more detail with respect to FIG. 4.

FIG. 4 shows an example of a portion of a marking produced using a raster scan pattern. The marking 430 includes laser-formed pixels 440. The marking 430 may be an example of a portion of a marking similar to the marking 230 of FIG. 2. A portion 414 of the substrate which has been modified to a lesser extent by the laser process (e.g., modified to only a minimal extent) is also shown in FIG. 4. In the example of FIG. 4, the pixels 440 are generally circular and have a radius R.

In the example of FIG. 4, the dashed lines 482 schematically indicate linear paths along which the laser is scanned. A laser pulse (which may include one or more sub-pulses) is directed onto the surface of the housing at one or more specified locations along one or more of the linear paths to produce the laser-formed pixel 440s. The separation $\Delta Y$ between the paths 482 is also shown. As shown in the example of FIG. 4, the separation between the paths 482 is substantially uniform.

The laser may be scanned to produce a maximum number of pixels per unit distance (e.g., pixels per inch or pixels per mm). This maximum number of pixels per unit distance produces a minimum center to center spacing ($\Delta X$) between adjacent pixels along the path, schematically indicated by the dashed lines 484. This spacing may also be referred to herein as a pitch. In some cases, a ratio of the minimum center to center spacing to the diameter of the laser-formed pixels (or the spot size of the laser) is from 0.5 to 0.9 or from 0.6 to 0.8. In additional cases, the minimum center to center spacing along a scan line is from about 6 microns to about 20 microns, or from about 7 microns to about 15 microns. The minimum center to center spacing ($\Delta X$) may be about equal to the separation $\Delta Y$ between the paths 482. As shown in FIG. 4, the actual center to spacing between at least some of the laser-formed pixels may be greater than this minimum center to center spacing.

The dashed lines 482 and lines 484 may be viewed as defining a grid, with the intersections of the dashed lines 482 and 484 defining potential locations of laser-formed pixels. In some cases, the density of the laser-formed pixels is specified in terms of the density with respect to this grid (also referred to herein as a grid density or as an array density). For example, if laser-formed pixels are formed at all the intersections of the dashed lines 482 and 484, the grid density is 100% and the density of laser-formed pixels is maximized (for a given diameter of the laser-formed pixels). A top view of laser-formed pixels having a local grid density approaching 100% is shown in the central region of FIG. 4 and to the left in FIG. 2. As shown in the example of FIG. 4, adjacent pixels may overlap when the local grid density is 100%. The example of FIG. 4 also shows that some "gaps" may be formed between overlapping pixels, so pixels may not cover all of the surface of the housing even when the local grid density is 100%. In the example of FIG. 4, the overall grid density is less than 100% since laser-formed pixels are not formed at all the intersections of the dashed lines 482 and 484. In some cases, the grid density in portions of the marking which include laser-formed pixels ranges from 5% to 100%, from 10% to 100%, or from 20% to 100%.

The areal density of the laser-formed pixels depends not only on the grid density, but on the size of the laser-formed pixels relative to the spacing $\Delta X$ and $\Delta Y$. In some embodiments, a lateral dimension (e.g., a diameter) of a laser-formed pixel is greater than or equal to the minimum center to center spacing. In some cases, a ratio of the minimum center to center spacing to the diameter of the laser-formed pixels is from 0.5 to 0.9 or from 0.6 to 0.8.

In some embodiments, the laser operating conditions are substantially the same during formation of each of the laser-formed pixels and therefore the laser-formed pixels are substantially uniform. The laser may produce a wavelength in the visible range (e.g., a green wavelength). The pulse duration may be from about 200 fs to about 800 fs, the average power may be from about 5 W to about 30 W or from about 10 W to about 25 W. The spot size may be from 6 µm to 20 µm. In some cases, the repetition rate may be from about 0.3 GHz to about 3.9 GHz.

In some embodiments, the laser may be operated in burst mode, with each burst including multiple sub-pulses. For example, the main pulse may be burst into a set of sub-pulses having a nanosecond burst spacing (e.g., in a range from about 10 ns to about 20 ns). As an additional example, the set of sub-pulses having a nanosecond burst spacing may also be burst into another set of sub-pulses having a picosecond burst spacing (e.g., in a range from about 200 ps to about 2500 ps). In embodiments, the number of pulses in a given burst may be in a range from 5 to 25. In some cases, a laser-formed pixel formed using a main pulse burst into one or more sets of sub-pulses may have a reduced height and/or surface roughness as compared to a laser-formed pixel formed using just the main pulse. Furthermore, a laser-formed pixel formed using a first set of sub-pulses which is then burst into a second set of sub-pulses may have a reduced height and/or surface roughness as compared to a laser-formed pixel formed using just the first set of sub-pulses. For example, a laser-formed pixel formed using a main pulse burst into one or more sets of sub-pulses may have a peak height that is one-third to one-half of a peak height of a laser-formed pixel formed using just the main pulse. In additional cases, a laser-formed pixel using a main pulse burst into one or more sets of sub-pulses may have a reduced L* value as compared to a laser-formed pixel formed using just the main pulse. Furthermore, a laser-formed pixel formed using a first set of sub-pulses which is then burst into a second set of sub-pulses may have a reduced L* and/or b* value as compared to a laser-formed pixel formed using just the first set of sub-pulses.

Figure 5:
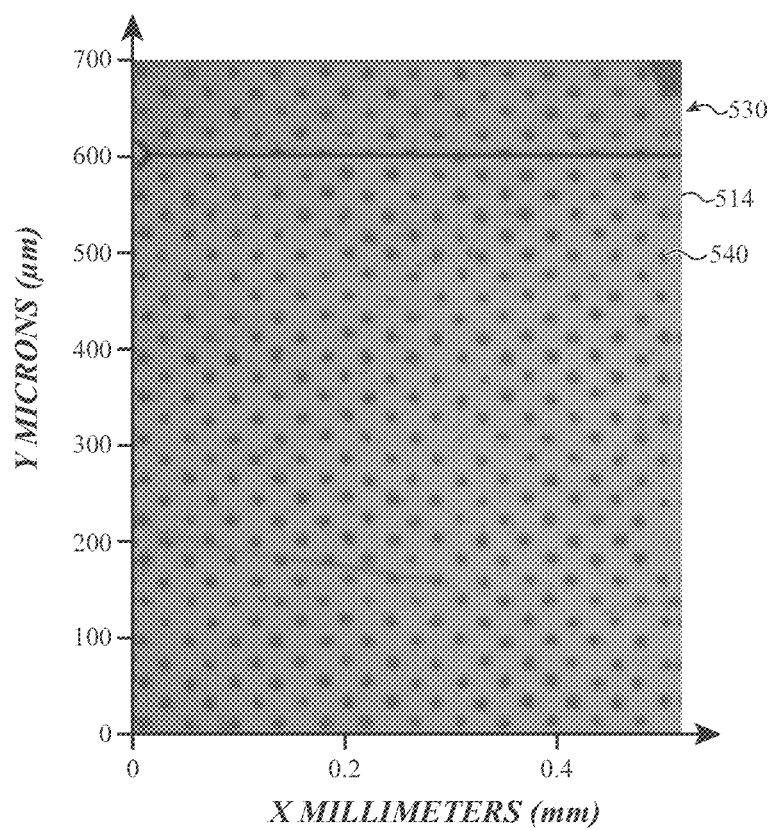
FIG. 5 shows another example of a marking including laser-formed pixels.

FIG. 5 shows another example of a marking including laser-formed pixels formed in a substrate. FIG. 5 is a magnified image showing a top view of the marking 530 including laser-formed pixels 540. A portion 514 of the substrate which has been modified to a lesser extent by the laser process (e.g., modified to only a minimal extent) is also shown in FIG. 5. The spacing of the laser-formed pixels is indicated on the horizontal axis and vertical axes.

The laser-formed pixels shown in FIG. 5 form a substantially regular array. The grid density of this array of laser-formed pixels is about 10%. This density of laser-formed pixels may produce a light gray color when a housing member (or other substrate) has a substantially white color. In the example of FIG. 5, the laser-formed pixels were formed in a substrate formed from a polymer comprising a titanium dioxide pigment and having a composition similar to that previously described with respect to FIGS. 1 and 2. This substrate has a L* value of 97.6, an a* value of 0.7, a b* value of −3.2 and an average gloss value of 98.5.

When the laser operating conditions are substantially uniform during formation of each of the laser-formed pixels, the laser-formed pixels may be substantially uniform in diameter as shown in FIG. 5. The marking has a L* value of 84.1, an a* value of −0.3 and a b* value of −5.4 and an average gloss value of 81. The method for forming the laser-formed pixels is similar to that previously described and is not repeated here. In some cases, a profilometer trace across laser-formed pixels similar to those of FIG. 5 shows that the surface features defined by the laser-formed pixels can have peak heights that are less than 1.5 microns and an average peak height difference between 0.25 microns and 0.3 microns. In some cases, an areal roughness measurement gives an arithmetical mean height (Sa) of about 0.02 microns and a root mean square height (Sq) of about 0.06 microns. These values may be determined as previously described with respect to FIG. 3 and that description is not repeated here.

Figure 6A:
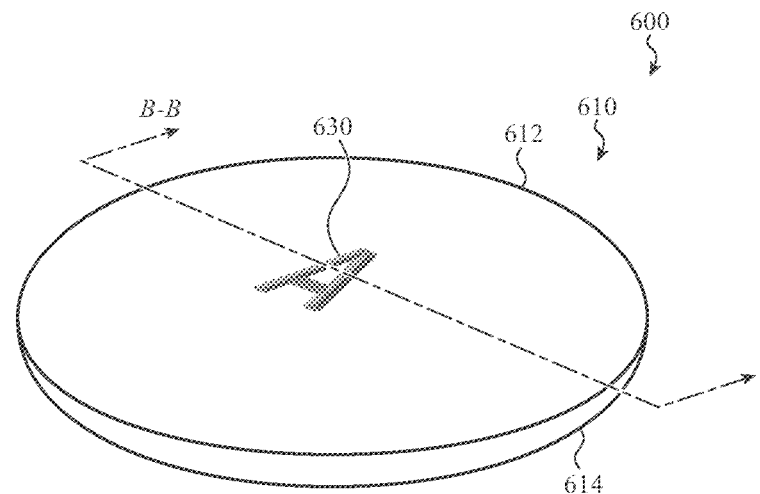
FIG. 6A shows another example of an electronic device including a laser-formed marking.
Figure 6B:
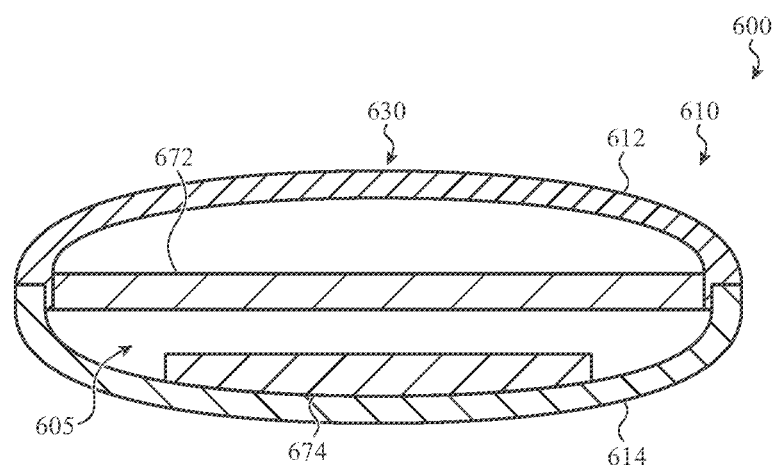
FIG. 6B shows a cross-sectional view of the electronic device of FIG. 6A.

FIG. 6A shows another example of an electronic device including a laser-formed marking. In the example of FIG. 6A, the electronic device 600 includes a housing 610 which includes a first housing member 612 and a second housing member 614 coupled to the first housing member 612. The first housing member 612 includes a laser-formed marking 630. In the example of FIG. 6A, the marking 630 defines a text marking.

The first housing member 612 includes a laser-modifiable material such as a polymer and a pigment dispersed within the polymer. The laser-modifiable material may define an exterior surface of the first housing member 612 and in some cases the first housing member 612 may be formed of the laser-modifiable material. The laser-modifiable material may be similar in composition and laser response to the laser-modifiable materials described with respect to FIGS. 1-5 and that description is not repeated here. The laser-formed marking 630 includes laser-formed pixels within a surface region of the housing member and these laser-formed pixels may be similar in geometry and other features as previously described with respect to FIGS. 1-5. The location of the laser-formed marking 630 is exemplary rather than limiting and in additional examples, the laser-formed marking 630 may alternately or additionally be formed on the housing member 614. In additional examples, the laser-formed marking 630 may define an image or other type of marking as previously described.

The housing member 614 may be formed of a material other than the laser-modifiable material of the housing member 612. For example, the housing member may be formed of one or more of a metal material (including a metal alloy), a glass material, glass ceramic material, or a ceramic material. The housing member 614 and the housing member 612 together define an interior volume, as shown in FIG. 6B. The interior volume may be configured to receive one or more electronic components. For example, the interior volume may be configured to receive one or more of a battery, electronic circuitry, or any of the components described with respect to FIG. 7.

FIG. 6B shows an example cross-sectional view of the electronic device 600 of FIG. 6A. As previously discussed, the electronic device 600 includes a first housing member 612 coupled to a second housing member 614. A laser-formed marking 630 is formed in the first housing member 612. The cross-section may be taken along the line B-B in FIG. 6A.

The housing 610 may define an interior volume 605 configured to receive one or more electronic components. FIG. 6B schematically shows two electronic components 672 and 674. This example is not limiting and in additional examples a greater or lesser number of electronic components and/or different electronic components may be included in the interior volume 605. More generally, the one or more electronic components may be as described with respect to FIG. 7 and that description is not repeated here.

In some embodiments, the electronic component 672 includes electronic circuitry. In some examples, the housing member 612 defines a front surface of the electronic device 600 and the electronic component 674 may be a battery operably coupled to the electronic circuitry. In additional examples, the housing member 614 defines a front surface of the electronic device and may define or include a transparent window positioned over the electronic component 674, which may be a display, such as a touch sensitive display.

Figure 7:
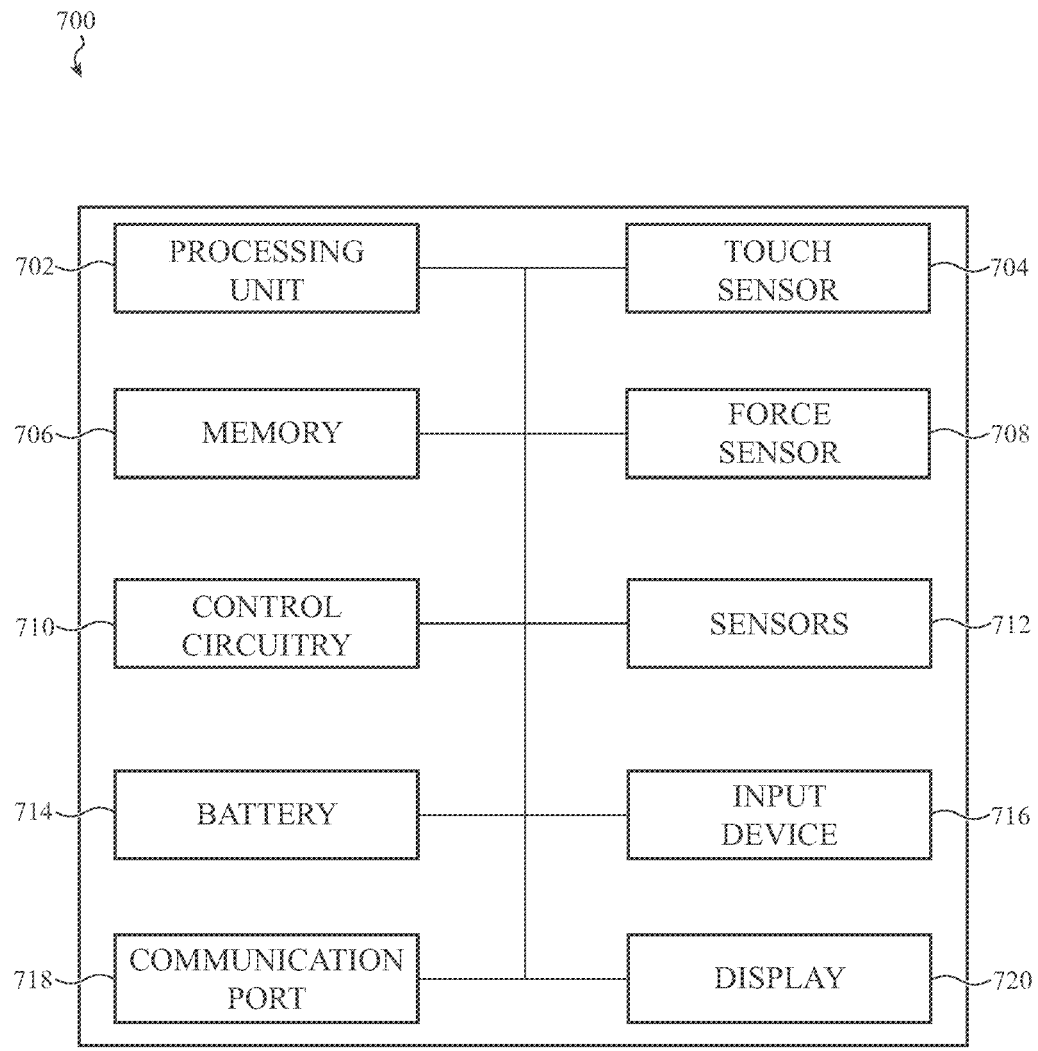
FIG. 7 shows a block diagram of components of an electronic device.

FIG. 7 shows a block diagram of components of a sample electronic device that can incorporate a housing as described herein. The schematic representation depicted in FIG. 7 may correspond to components of the devices depicted in FIGS. 1 to 6B as described above. However, FIG. 7 may also more generally represent other types of electronic devices including a housing as described herein.

In embodiments, an electronic device 700 may include sensors 712 to provide information regarding configuration and/or orientation of the electronic device in order to control the output of the display. For example, a portion of the display 720 may be turned off, disabled, or put in a low energy state when all or part of the viewable area of the display 720 is blocked or substantially obscured. As another example, the display 720 may be adapted to rotate the display of graphical output based on changes in orientation of the device 700 (e.g., 90 degrees or 180 degrees) in response to the device 700 being rotated.

The electronic device 700 also includes a processing unit 702 operably connected with a computer-readable memory 706. The processing unit 702 may be operatively connected to the memory 706 component via an electronic bus or bridge. The processing unit 702 may be implemented as one or more computer processors or microcontrollers configured to perform operations in response to computer-readable instructions. The processing unit 702 may include a central processing unit (CPU) of the device 700. Additionally, and/or alternatively, the processing unit 702 may include other electronic circuitry within the device 700 including application specific integrated chips (ASIC) and other microcontroller devices. The processing unit 702 may be configured to perform functionality described in the examples above.

The memory 706 may include a variety of types of non-transitory computer-readable storage media, including, for example, read access memory (RAM), read-only memory (ROM), erasable programmable memory (e.g., EPROM and EEPROM), or flash memory. The memory 706 is configured to store computer-readable instructions, sensor values, and other persistent software elements.

The electronic device 700 may include control circuitry 710. The control circuitry 710 may be implemented in a single control unit and not necessarily as distinct electrical circuit elements. As used herein, "control unit" will be used synonymously with "control circuitry." The control circuitry 710 may receive signals from the processing unit 702 or from other elements of the electronic device 700.

As shown in FIG. 7, the electronic device 700 includes a battery 714 that is configured to provide electrical power to the components of the electronic device 700. The battery 714 may include one or more power storage cells that are linked together to provide an internal supply of electrical power. The battery 714 may be operatively coupled to power management circuitry that is configured to provide appropriate voltage and power levels for individual components or groups of components within the electronic device 700. The battery 714, via power management circuitry, may be configured to receive power from an external source, such as an alternating current power outlet. The battery 714 may store received power so that the electronic device 700 may operate without connection to an external power source for an extended period of time, which may range from several hours to several days.

In some embodiments, the electronic device 700 includes one or more input devices 716. The input device 716 is a device that is configured to receive input from a user or the environment. The input device 716 may include, for example, a push button, a touch-activated button, a capacitive touch sensor, a touch screen (e.g., a touch-sensitive display or a force-sensitive display), a capacitive touch button, dial, crown, or the like. In some embodiments, the input device 716 may provide a dedicated or primary function, including, for example, a power button, volume buttons, home buttons, scroll wheels, and camera buttons.

The device 700 may also include one or more sensors or sensor modules, such as at touch sensor 704, a force sensor 708, or other sensors 712 such as a capacitive sensor, an accelerometer, a barometer, a gyroscope, a proximity sensor, a light sensor, or the like. In some cases, the device 700 includes a sensor array (also referred to as a sensing array) which includes multiple sensors. For example, a sensor array associated with a protruding feature of a cover member may include an ambient light sensor, a Lidar sensor, and a microphone. The sensors may be operably coupled to processing circuitry. In some embodiments, the sensors may detect deformation and/or changes in configuration of the electronic device and be operably coupled to processing circuitry that controls the display based on the sensor signals. In some implementations, output from the sensors is used to reconfigure the display output to correspond to an orientation or folded/unfolded configuration or state of the device. Example sensors for this purpose include accelerometers, gyroscopes, magnetometers, and other similar types of position/orientation sensing devices. In addition, the sensors may include a microphone, acoustic sensor, light sensor (including ambient light, infrared (IR) light, ultraviolet (UV) light, optical facial recognition sensor, a depth measuring sensor (e.g., a time of flight sensor), a health monitoring sensor (e.g., an electrocardiogram (erg) sensor, a heart rate sensor, a photoplethysmogram (ppg) sensor, a pulse oximeter, a biometric sensor (e.g., a fingerprint sensor), or other types of sensing device.

In some embodiments, the electronic device 700 includes one or more output devices configured to provide output to a user. The output device may include a display 720 that renders visual information generated by the processing unit 702. The output device may also include one or more speakers to provide audio output. The output device may also include one or more haptic devices that are configured to produce a haptic or tactile output along an exterior surface of the device 700.

The display 720 may include a liquid-crystal display (LCD), a light-emitting diode (LED) display, an LED-backlit LCD display, an organic light-emitting diode (OLED) display, an active layer organic light-emitting diode (AMOLED) display, an organic electroluminescent (EL) display, an electrophoretic ink display, or the like. If the display 720 is a liquid-crystal display or an electrophoretic ink display, the display 720 may also include a backlight component that can be controlled to provide variable levels of display brightness. If the display 720 is an organic light-emitting diode or an organic electroluminescent-type display, the brightness of the display 720 may be controlled by modifying the electrical signals that are provided to display elements. In addition, information regarding configuration and/or orientation of the electronic device may be used to control the output of the display as described with respect to sensors 712. In some cases, the display is integrated with a touch and/or force sensor in order to detect touches and/or forces applied along an exterior surface of the device 700.

The electronic device 700 may also include a communication port 718 that is configured to transmit and/or receive signals or electrical communication from an external or separate device. The communication port 718 may be configured to couple to an external device via a cable, adaptor, or other type of electrical connector. In some embodiments, the communication port 718 may be used to couple the electronic device 700 to a host computer.

The electronic device 700 may also include at least one accessory, such as a camera, a flash for the camera, or other such device. The camera may be part of a camera array or sensing array that may be connected to other parts of the electronic device 700 such as the control circuitry 710.

As used herein, the terms "about," "approximately," "substantially," "similar," and the like are used to account for relatively small variations, such as a variation of +/−10%, +/−5%, +/−2%, or +/−1%. In addition, use of the term "about" in reference to the endpoint of a range may signify a variation of +/−10%, +/−5%, +/−2%, or +/−1% of the endpoint value. In addition, disclosure of a range in which at least one endpoint is described as being "about" a specified value includes disclosure of the range in which the endpoint is equal to the specified value.

As used herein, the phrase "one or more of" or "at least one of" or "preceding a series of items, with the term "and" or "or" to separate any of the items, modifies the list as a whole, rather than each member of the list. The phrase "one or more of" or "at least one of" does not require selection of at least one of each item listed; rather, the phrase allows a meaning that includes at a minimum one of any of the items, and/or at a minimum one of any combination of the items, and/or at a minimum one of each of the items. By way of example, the phrases "one or more of A, B, and C" or "one or more of A, B, or C" each refer to only A, only B, or only C; any combination of A, B, and C; and/or one or more of each of A, B, and C. Similarly, it may be appreciated that an order of elements presented for a conjunctive or disjunctive list provided herein should not be construed as limiting the disclosure to only that order provided.

The following discussion applies to the electronic devices described herein to the extent that these devices may be used to obtain personally identifiable information data. It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not intended to be exhaustive or to limit the embodiments to the precise forms disclosed. It will be apparent to one of ordinary skill in the art that many modifications and variations are possible in view of the above teachings.

What is claimed is:

1. A housing for an electronic device, the housing comprising:
   a housing member comprising a polymer and a pigment dispersed within the polymer, the housing member defining:
      a marking formed in a first surface region of the housing member, the marking defined, at least in part, by an array of laser-formed pixels, a portion of the marking having:
         a first lightness value L* ranging from 40 to 65; and
         an arithmetical mean height (Sa) ranging from 0.01 microns to 0.5 microns; and
      a second surface region of the housing member, the second surface region at least partially surrounding the marking and having:
         a second lightness value L* ranging from 80 to 100; and
         a b* value less than 4 and greater than −10.

2. The housing of claim 1, wherein:
   the housing defines an interior volume configured to receive a battery and electronic circuitry;
   the polymer is one or more of a polycarbonate or an acrylonitrile butadiene styrene;
   the pigment is a titanium oxide;
   the portion of the marking is a first portion having a first pixel density; and
   the marking includes a grayscale image and the grayscale image includes the first portion and a second portion of the marking having a second pixel density less than the first pixel density.

3. The housing of claim 2, wherein the portion of the marking has:
   a b* value greater than −5 and less than 0; and
   an a* value greater than −1.2 and less than −0.5.

4. The housing of claim 2, wherein:
   the first pixel density ranges from 90% to 100%;
   the first pixel density defines a first gloss value greater than 6 gloss units and less than 50 gloss units as measured at 60 degrees; and
   the second surface region has a second gloss value from 90 gloss units to 100 gloss units as measured at 60 degrees.

5. The housing of claim 4, wherein the first gloss value is greater than 30 gloss units and less than 50 gloss units as measured at 60 degrees.

6. The housing of claim 2, wherein:
   the first portion includes a set of laser-formed pixels of the array of laser-formed pixels; and
   the set of laser-formed pixels includes overlapping laser-formed pixels.

7. The housing of claim 2, wherein each laser-formed pixel of the array of laser-formed pixels has a diameter from about 10 microns to about 18 microns.

8. A housing comprising:
   a housing member defining an exterior surface and comprising a housing material;
   a marking formed in a first region of the exterior surface and defining an image, the marking comprising an array of laser-formed pixels formed within the housing material, each laser-formed pixel of the array of laser-formed pixels having a diameter from 10 microns to 20 microns, a first portion of the marking having:
      a minimum center to center spacing between adjacent laser-formed pixels of the array of laser-formed pixels, a ratio of the minimum center to center spacing to the diameter ranging from 0.5 to 0.9;
      a first lightness value L* ranging from 45 to 65; and
      a first b* value greater than −7 and less than 0; and
   a second region of the exterior surface at least partially surrounding the image and having:
      a second lightness value L* ranging from 85 to 100; and
      a second b* value greater than −7 and less than 0.

9. The housing of claim 8, wherein:
   the first portion of the marking includes a set of laser-formed pixels of the array of laser-formed pixels;
   each laser-formed pixel of the set of laser-formed pixels defines a peak; and
   an average height of peaks of the set of laser-formed pixels ranges from 0.2 microns to 0.75 microns.

10. The housing of claim 8, wherein each laser-formed pixel of the array of laser-formed pixels has a depth from 3 microns to 15 microns.

11. The housing of claim 8, wherein a difference between a gloss value of the second region and a gloss value of the first region is less than 90 gloss units.

12. The housing of claim 8, wherein the housing material comprises metal oxide pigment particles dispersed in a polymer matrix.

13. The housing of claim 12, wherein the polymer matrix comprises polycarbonate, acrylonitrile butadiene styrene, or a combination thereof.

14. The housing of claim 8, wherein:
   the housing material defines an interior volume of the housing; and
   the housing is configured to enclose a battery and electronic circuitry operably coupled to the battery.

15. An electronic device comprising:
   a housing defining an interior volume and comprising:
      a marking formed in a first surface region of the housing and defining an image, the marking comprising laser-formed pixels formed within a housing material, and a portion of the marking having:
         a pixel density ranging from 90% to 100%;
         a first lightness value L* ranging from 40 to 65; and a first gloss value ranging from 10 gloss units to less than 50 gloss units as measured at 60 degrees; and
a second surface region adjacent to the first surface region and having:
a second lightness value L* ranging from 80 to 100; and
a second gloss value ranging from 90 gloss units to 100 gloss units as measured at 60 degrees;
a battery positioned within the interior volume; and
electronic circuitry positioned within the interior volume and operably coupled to the battery.

16. The electronic device of claim 15, wherein a difference between the second gloss value and the first gloss value is less than 60 gloss units.

17. The electronic device of claim 15, wherein:
each of the laser-formed pixels has a diameter from about 10 microns to about 20 microns; and
the portion of the marking has an arithmetical mean height ranging from 0.01 microns to 0.3 microns.

18. The electronic device of claim 15, wherein:
the first surface region has a first b* value;
the second surface region has a second b* value; and
a magnitude of a difference between the first b* value and the second b* value is less than or equal to 1.5.

19. The electronic device of claim 15, wherein:
the laser-formed pixels define an array; and
the pixel density is an array density.

20. The electronic device of claim 15, wherein the housing material comprises a titanium dioxide pigment in a polymer matrix.

* * * * *